(12) United States Patent
Seo et al.

(10) Patent No.: US 7,095,551 B2
(45) Date of Patent: Aug. 22, 2006

(54) WAVELENGTH CONVERTER FOR GENERATING WAVELENGTH TUNABLE LASER OPTICAL SOURCE IN ITSELF

(75) Inventors: Young-kwang Seo, Seoul (KR);
Hyun-chin Kim, Seoul (KR);
Hyun-surk Ryu, Suwon-si (KR);
June-koo Rhee, Seongnam-si (KR);
Keun-joo Park, Yongin-si (KR);
Chun-ju Youn, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 11/296,332

(22) Filed: Dec. 8, 2005

(65) Prior Publication Data

US 2006/0119929 A1  Jun. 8, 2006

(30) Foreign Application Priority Data

Dec. 8, 2004 (KR) .................. 10-2004-0103006

(51) Int. Cl.
*G02F 1/365* (2006.01)
*G02F 2/02* (2006.01)

(52) U.S. Cl. ...................... 359/332; 359/326
(58) Field of Classification Search ......... 359/326–332
See application file for complete search history.

(56) References Cited

U.S. PATENT DOCUMENTS 5,946,129 A * 8/1999 Xu et al. .................... 359/332
6,046,841 A * 4/2000 Mahgerefteh et al. ...... 359/326
6,608,715 B1 * 8/2003 Zhang et al. ............... 359/332
6,704,138 B1 * 3/2004 Dijaili et al. ............... 359/344

* cited by examiner

Primary Examiner—John D. Lee
(74) Attorney, Agent, or Firm—Sughrue Mion, PLLC

(57) ABSTRACT

A wavelength converter for generating a wavelength tunable laser optical source in itself is disclosed. The wavelength converter includes a first semiconductor optical amplifier for generating an optical noise, generating and outputting a first optical source by amplifying the generated optical noise if an external current is applied, first and second distributed Bragg reflectors for reflecting only a component of a specified wavelength range among components of the optical noise and applying the reflected component to the first semiconductor optical amplifier, and a second semiconductor optical amplifier for receiving an optical source divided from the optical source reflected by and outputted from the first distributed Bragg reflector and an input data optical source, generating and outputting a second optical source by changing a phase of the divided optical source according to a digital signal from the input data optical source. The first and second optical sources outputted from the first and second semiconductor optical amplifiers are added together, and a signal of which the wavelength is converted through either a constructive interference or a destructive interference of the added first and second optical sources is outputted.

10 Claims, 5 Drawing Sheets

WAVELENGTH CONVERTER

WAVELENGTH CONVERTER

λS Input    λC Output

ER < 7 dB

ER > 10 dB

WAVELENGTH CONVERTER FOR GENERATING WAVELENGTH TUNABLE LASER OPTICAL SOURCE IN ITSELF

This application claims benefit under 35 U.S.C. § 119 from Korean Patent Application No. 2004-103006, filed on Dec. 8, 2004, the entire content of which is incorporated herein by reference.

BACKGROUND OF THE INVENTION

1. Field of the Invention

The present invention relates to a wavelength converter capable of generating a wavelength tunable laser optical source in itself without any separate wavelength tunable laser and using the generated optical source as a probe optical source of the wavelength converter.

2. Description of the Related Art

Recently, with a rapid increase of the amount of information at home and abroad, the capacity of a transmission system has become massive. Particularly, a wavelength division multiplexing (WDM) system that can efficiently use wide bandwidths provided by optical fiber using optical wavelengths of various channels becomes a matter of great concern. The core element in a communication network of a transmission system using such a WDM system is an optical wavelength converter in addition to an optical amplifier.

The optical wavelength converter is a device for converting the wavelength of a transmitted signal irrespective of a transmission speed or a transmission type, and plays the following role. First, it reduces blocking due to a wavelength contention in a WDM communication network, and makes it possible to usefully reuse the wavelength. Second, it increases the flexibility and capacity of a network with respect to fixed wavelengths. Third, it makes it possible to distribute and manage the network and enables protection switching to be performed more easily.

Schemes for implementing the optical wavelength converter that plays the above-described role using a semiconductor optical amplifier (hereinafter referred to as an "SOA") have mainly been researched. First is an XGM (Cross Gain Modulation) system that uses an XGM characteristic in the SOA and that is implemented most simply. Second is an XPM (Cross Phase Modulation) system that uses an XPM characteristic in the SOA.

Since the XPM system has a relatively simple structure and has a superior wavelength conversion performance with respect to a high-speed data, it is used in diverse fields.

FIG. 1 is a schematic view of a Mach-Zehnder interferometer-type SOA-XPM wavelength converter. Referring to FIG. 1, the operation of the Mach-Zehnder interferometer-type SOA-XPM wavelength converter will now be explained. First, if a pump optical signal having a wavelength of $\lambda S$ is inputted to SOA1, the carrier density in an SOA1 active layer is decreased due to a stimulated emission. Accordingly, the index of refraction of the active layer is changed, and thus if the probe signal having a wavelength of $\lambda C$ passes through the SOA1, a phase change occurs. Accordingly, if an output pulse signal outputted from the SOA1 and a CW (Continuous Wave) signal outputted from SOA2 are added together at a Mach-Zehnder interferometer-type output terminal and the two signals are in an out-of-phase condition, a destructive interference occurs between the signals and no signal is outputted, while if the two signals are in an in-phase condition, a constructive interference occurs between the signals and a signal is outputted. At this time, information of the pump optical signal having a wavelength of $\lambda S$ is transferred to the probe signal having a wavelength of $\lambda C$ to cause a wavelength conversion to occur.

In the Mach-Zehnder interferometer-type SOA-XPM wavelength converter as described above, the CW probe optical signal having a wavelength of $\lambda C$ of which the wavelength conversion should be performed is used as an input of the wavelength converter together with the pump optical signal having a wavelength of $\lambda S$ which carries digital data information. Generally, the probe optical signal is provided using a separate optical source outside the wavelength converter, and this causes the whole size of the wavelength converter to increase. Also, in consideration of the case in which diverse wavelengths are subject to wavelength conversion, a continuously or discretely wavelength-tunable optical source is required. Additionally, diverse researches for integrating the probe optical source and the wavelength converter in consideration of the above-described problem have been made.

FIG. 2 is a schematic view of a wavelength converter into which a DFB (Distributed Feed-Back) laser is integrated. Referring to FIG. 2, the wavelength converter into which the DFB laser is integrated is provided by integrating the DFB laser onto the same semiconductor substrate as the probe optical source of the Mach-Zehnder interferometer-type SOA-XPM wavelength converter as illustrated in FIG. 1. However, the maximum wavelength tunable range of the DFB laser is generally limited to about 2 nm. In order to improve this, a treatise on a case that a wavelength tunable laser is integrated into a wavelength converter as a probe optical source that is operable in a wide wavelength range has recently been published.

FIG. 3 is a schematic view of an SOA-XPM wavelength converter into which a wavelength tunable laser is integrated. Referring to FIG. 3, the tunable laser 40 includes an optical gain medium 10 for providing an optical gain, a phase shift medium 20 for adjusting an optical phase and first and second distributed Bragg reflectors (DBRs) 30a and 30b operating as optical mirrors or reflectors. The first distributed Bragg reflector 30a is located in the front of the optical gain medium 10, and the second distributed Bragg reflector 30b is located in the rear of the optical gain medium 10.

By applying current to the first and second distributed Bragg reflectors 30a and 30b and the phase shift medium 20, the laser 40 is controlled to oscillate at a desired wavelength. The first and second distributed Bragg reflectors 30a and 30b perform a coarse tuning so that the tunable laser 40 oscillates at a desired wavelength. In addition, the phase shift medium 20 performs a fine tuning. By applying current from an outside source to the optical gain medium 10, the strength of the output optical source of the tunable laser 40 is controlled. The tunable laser 40 is operable even in the wavelength range of 30 nm or more ([IEEE Photonics Technology Letters, vol. 15, no. 8, 2003], [IEEE Photonics Technology Letters, vol. 16, no. 10, 2004]).

However, since the wavelength converter into which the tunable laser is integrated as illustrated in FIG. 3 is obtained by integrating the tunable laser together with the wavelength converter, it is difficult to miniaturize the wavelength converter and its power consumption becomes great.

SUMMARY OF THE INVENTION

The present invention has been developed in order to solve the above drawbacks and other problems associated with the conventional arrangement.

An aspect of the present invention is to provide a wavelength converter capable of generating a wavelength tunable laser optical source in itself without any separate wavelength tunable laser and using the generated optical source as a probe optical source of the wavelength converter.

The foregoing and other objects and advantages are substantially realized by providing a wavelength converter for generating a wavelength tunable laser optical source in itself, according to an embodiment of the present invention, comprising a first semiconductor optical amplifier for generating an optical noise, generating and outputting a first optical source by amplifying the generated optical noise if an external current is applied, first and second distributed Bragg reflectors for reflecting only a component of a specified wavelength range among components of the optical noise and applying the reflected component to the first semiconductor optical amplifier, and a second semiconductor optical amplifier for receiving an optical source divided from the optical source reflected by and outputted from the first distributed Bragg reflector and an input data optical source, generating and outputting a second optical source by changing a phase of the divided optical source according to a digital signal from the input data optical source, wherein the first and second optical sources outputted from the first and second semiconductor optical amplifiers are added together, and a signal of which the wavelength is converted through either a constructive interference or a destructive interference of the added first and second optical sources is outputted.

In the first optical source outputted from the first semiconductor optical amplifier, no phase change occurs.

The constructive interference occurs if phases of the first and second optical sources coincide with each other.

The destructive interference occurs if phases of the first and second optical sources do not coincide with each other.

It is preferable, but not necessary, that the size of the first optical source is varied according to the size of an external current applied to the first semiconductor optical amplifier.

The wavelength converter according to the present invention may further comprise a phase shift medium for performing a fine tuning of the wavelength of the first optical source.

It is preferable, but not necessary, that the phase shift medium is located in the middle of the first semiconductor optical amplifier and the first distributed Bragg reflector.

It is preferable, but not necessary, that the phase shift medium is located in the middle of the first semiconductor optical amplifier and the second distributed Bragg reflector.

The wavelength converter according to the present invention may further comprise a third semiconductor optical amplifier for adjusting the size of the input data optical source.

It is preferable, but not necessary, that the first semiconductor optical amplifier, the second semiconductor optical amplifier, the first distributed Bragg reflector and the second distributed Bragg reflector are integrated onto the same substrate.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Figure 1:
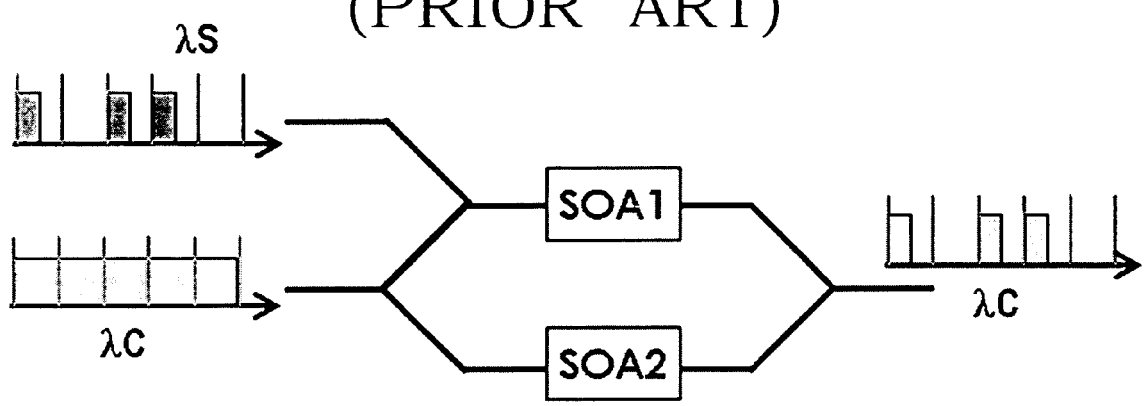
FIG. 1 is a schematic view of a Mach-Zehnder interferometer-type SOA-XPM wavelength converter.
Figure 2:
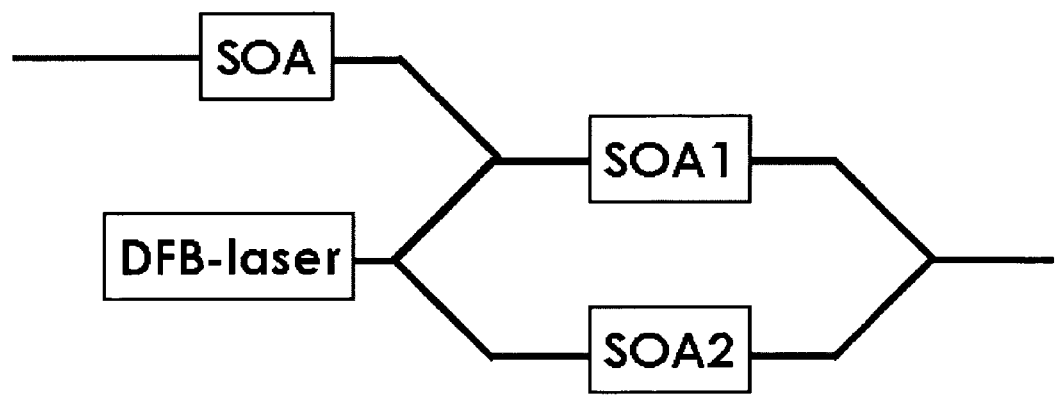
FIG. 2 is a schematic view of a wavelength converter into which a DFB laser is integrated; 1

Certain embodiments of the present invention will be described in greater detail with reference to the accompanying drawings.

In the following description, the same drawing reference numerals are used for the same elements even in different drawings. Description of some items, such as construction details and elements are provided merely to assist in a comprehensive understanding of the invention. Thus, it is apparent that the present invention can be carried out without those described items. Also, well-known functions or constructions are not described in detail since doing so would obscure the invention in unnecessary detail.

Figure 3:
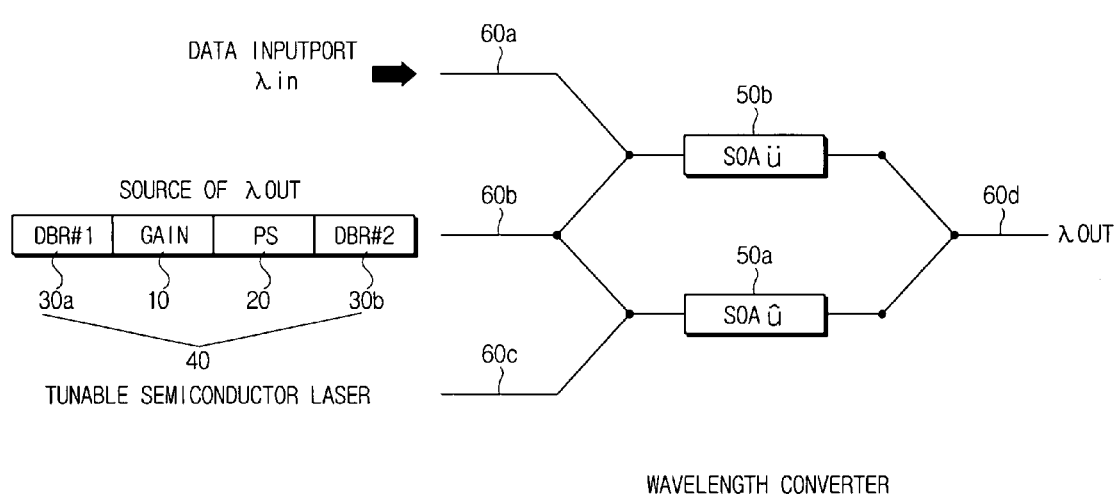
FIG. 3 is a schematic view of an SOA-XPM wavelength converter into which a wavelength tunable laser is integrated.
Figure 4:
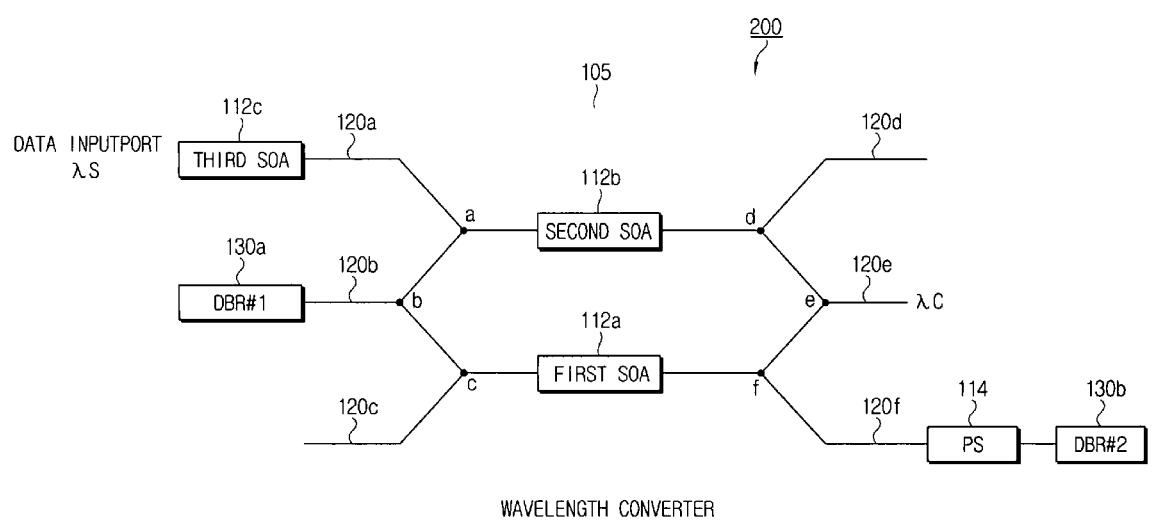
FIG. 4 is a view illustrating a wavelength converter for generating a wavelength tunable laser in itself according to an exemplary embodiment of the present invention.

FIG. 4 is a view illustrating a wavelength converter for generating a wavelength tunable laser in itself according to an embodiment of the present invention. Referring to FIG. 4, the wavelength converter 200 according to the present embodiment is discriminated from the SOA-XPM wavelength converter into which the tunable laser is integrated as illustrated in FIG. 3 as follows. In the SOA-XPM wavelength converter 100 into which the tunable laser is integrated as illustrated in FIG. 3, two independent function blocks, i.e., the tunable laser 40 to be used as the probe optical source and the wavelength converter 100, are integrated onto the same semiconductor substrate. By contrast, in the wavelength converter 200 according to the present embodiment, a tunable laser that is the probe optical source is not separately provided.

The wavelength converter 200 according to the present embodiment of the invention includes a first semiconductor optical amplifier 112a, a second semiconductor optical amplifier 112b, a phase shift medium 114, first and second distributed Bragg reflectors 130a and 130b and waveguides 120a ~120f for connecting the above-described constituent elements, which are integrated onto the same semiconductor substrate (not illustrated).

The first and second semiconductor optical amplifiers 112a and 112b serve as SOAs (Semiconductor Optical Amplifiers) in a general interferometer wavelength converter. The first semiconductor optical amplifier 112a is in association with the first and the second distributed Bragg reflectors and generates a probe optical source. The operation of the first semiconductor optical amplifier will be explained later. Additionally, a third semiconductor optical amplifier 112c that is located at an input part of the wavelength converter optimizes an SOA-XPM wavelength conversion operation by adjusting the strength of a pump optical source.

The first and second distributed Bragg reflectors 130a and 130b reflectors reflect only a part corresponding to a specified wavelength out of the optical source applied through the first semiconductor optical amplifier 112a. Additionally, the first and second distributed Bragg reflectors 130a and 130b can tune the wavelengths of the optical sources reflected from the first and second distributed Bragg reflectors 130a and 130b by independently controlling current being applied from an outside source to the first and second distributed Bragg reflectors 130a and 130b.

The phase shift medium 114 performs a fine tuning. That is, by controlling the current being applied from the outside, the phase shift medium 114 can tune the wavelength of the optical source passing through the phase shift medium. Meanwhile, although the phase shift medium 114 is located between the second distributed Bragg reflector 130b and a point f in FIG. 4, it may be located between the first distributed Bragg reflector 130a and a point b, or in the front or rear of the first semiconductor optical amplifier 112a if desired. Additionally, if an accurate control of the wavelength of the probe optical source is not required, the phase shift medium 114 may not be considered.

The waveguides 120a~120f that connect the respective constituent elements form a symmetrical structure, and uniformly keep optical losses occurring at branch points a~f of the respective waveguides 120a~120f. In the embodiment of the present invention, the strength of the optical source is divided into two at the respective branch point a~f.

Hereinafter, the operation of the wavelength converter that generates a tunable laser in itself and uses the generated laser as the probe optical source will be explained.

First, current is applied from the outside to the first and second semiconductor optical amplifiers 112a and 112b. If the current is applied to the first semiconductor optical amplifier 112a, an optical noise component of a minute size occurs. This optical noise component is inputted to the first distributed Bragg reflector 130a or to the second distributed Bragg reflector 130b through the phase shift medium 114.

The first or second distributed Bragg reflector 130a or 130b reflects only a part corresponding to a specified wavelength of the applied optical noise component, and the first semiconductor optical amplifier 130a amplifies the reflected optical noise component of the specified wavelength. Here, the first and second distributed Bragg reflectors 130a and 130b form a kind of resonance structure, and the optical noise component generated by the applied external current is amplified whenever it passes through the first semiconductor optical amplifier 112a to provide the probe optical source of a specified size. At this time, by independently controlling the current being applied to the first and second distributed Bragg reflectors 130a and 130b and the phase shift medium 114, the probe optical source of a desired wavelength can be obtained. Through the above-described process, the wavelength converter 200 according to the present invention generates the tunable probe optical source in itself.

Meanwhile, if it is assumed that the probe optical source reflected from the first distributed Bragg reflector 130a is divided into two at the point b, the phase of one divided probe optical source that passes through the second semiconductor optical amplifier 112b is changed according to a digital signal of the pump optical source having a wavelength of λS that contains signal information. Meanwhile, the phase of the other divided probe optical source that passes through the first semiconductor optical amplifier 112a is kept as it is.

Accordingly, the optical source of which the phase is changed as it passes through the second semiconductor optical amplifier 112b and the optical source of which the phase is not changed as it passes through the first semiconductor optical amplifier 112a are added together at the point e to cause the constructive interference or the destructive interference to occur, and in this process, information carried on the pump optical source having the wavelength of λS is transferred to the probe optical source. At this time, the waveguides 120a~120f that connect the respective parts of the wavelength converter 200 form a symmetrical structure, and thus the optical losses occurring at the branch points of the respective waveguides 120a~120f are kept uniform. Accordingly, the strengths of the two optical sources are kept uniform in the process of adding the optical sources having passed through the first and second semiconductor optical amplifiers 112a and 112b, and thus the efficiency of interference between the two optical sources can be improved. Additionally, the extinction ratio of the digital signal of which the wavelength is changed to the wavelength of the probe optical source can be improved.

FIGS. 5A to 5C and 6A to 6C are views illustrating the results of simulation according to an embodiment of the present invention. For the simulation as illustrated in FIGS. 5A to 5C and 6A to 6C, a simulator commercialized by VPI Photonics was used.

Figure 5A:
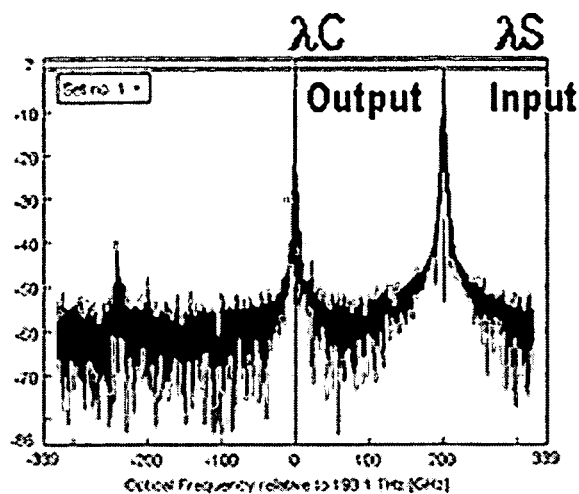
FIGS. 5A to 5C and 6A to 6C are views illustrating results of simulation according to an embodiment of the present invention.
Figure 5B:
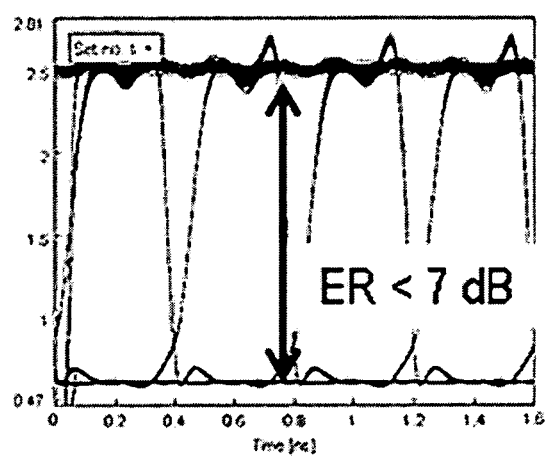
Figure 5C:
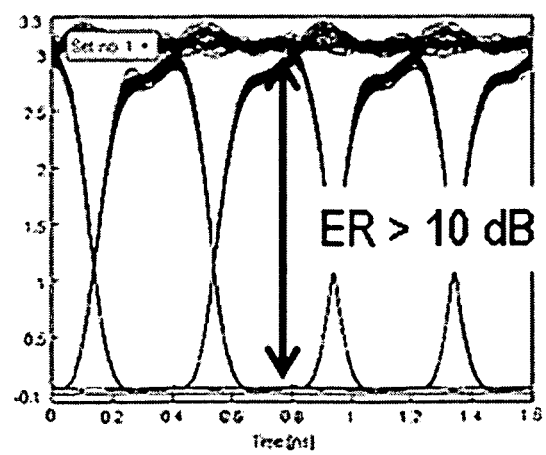

FIG. 5A illustrates optical spectrums of the input optical signal of λS and the probe optical source in the case in which the input optical signal is applied, being apart from the reference frequency as far as +200 GHz, and the wavelength of the probe optical source oscillated by the wavelength converter itself coincides with that of the reference frequency. FIG. 5B is a view illustrating in detail the input optical signal of λS as illustrated in FIG. 5A. In FIG. 5B, it is assumed that the extinction ratio (ER) is 7 dB and less. FIG. 5C is a view illustrating in detail the final output waveform in the case in which the input optical signal of λS as illustrated in FIG. 5B is inputted to the wavelength converter. Referring to FIG. 5C, the waveform finally outputted from the wavelength converter has an improved ER in comparison to the input optical signal of λS.

Figure 6A:
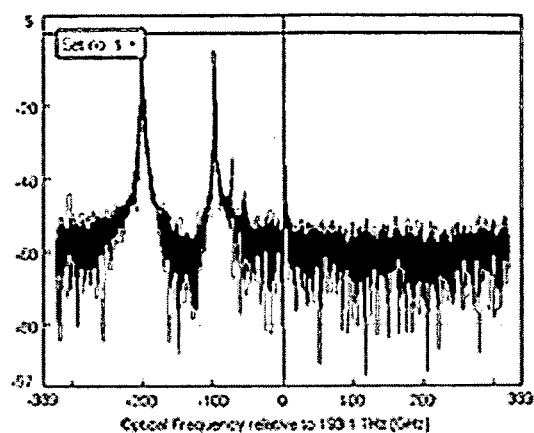
Figure 6B:
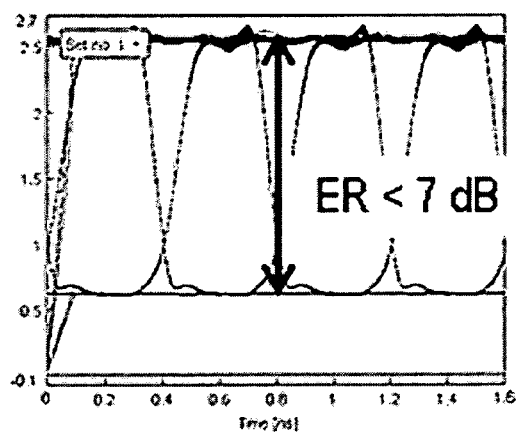
Figure 6C:
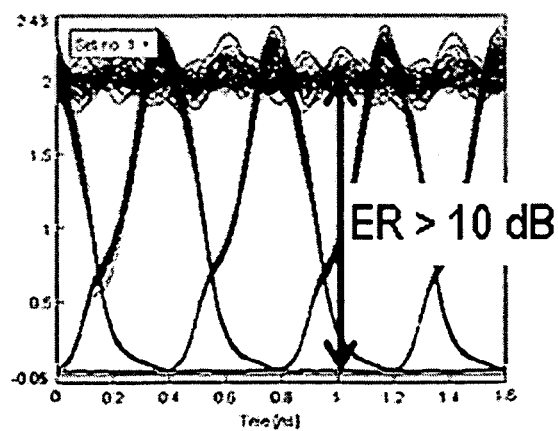

In the same manner, FIG. 6A illustrates optical spectrums of the input optical signal of λS and the probe optical source in the case in which the input optical signal is applied, being apart from the reference frequency as far as −200 GHz, and the wavelength of the probe optical source oscillated by the wavelength converter itself is apart from the reference frequency as far as −100 GHz. FIG. 6B is a view illustrating in detail the input optical signal of λS as illustrated in FIG. 6A. In FIG. 6B, it is assumed that the extinction ratio (ER) is 7 dB and less. FIG. 6C is a view illustrating in detail the final output waveform of λC in the case in which the input optical signal of λS as illustrated in FIG. 6B is inputted to the wavelength converter. Referring to FIG. 6C, the waveform of λC finally outputted from the wavelength converter has an improved ER in comparison to the input optical signal of λS.

As described above, according to the present invention, by properly arranging the distributed Bragg reflectors and the phase shift medium, which correspond to passive areas, in the function block of the existing wavelength converter, the wavelength converter can also serve as the probe optical source. That is, in a state that any separate tunable laser is not integrated together with the wavelength converter, the wavelength converter generates the tunable laser optical source in itself, and uses the generated optical source as the probe optical source of the wavelength converter. Accordingly, the size of the integrated module can be reduced as it performs the same function as the existing wavelength converter, and the power consumption can be reduced as well.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A wavelength converter comprising:
   a first semiconductor optical amplifier configured to generate an optical noise, and to generate and output a first optical source by amplifying the generated optical noise if a current is applied to the first semiconductor optical amplifier;
   first and second distributed Bragg reflectors configured to reflect only a component of a specified wavelength range among components of the optical noise and to apply the reflected component to the first semiconductor optical amplifier; and
   a second semiconductor optical amplifier configured to receive an optical source divided from the optical source reflected by and outputted from the first distributed Bragg reflector and an input data optical source, to generate and output a second optical source by changing a phase of the divided optical source according to a digital signal from the input data optical source;
   wherein the first and second optical sources outputted from the first and second semiconductor optical amplifiers are added together, and a signal of which the wavelength is converted through either a constructive interference or a destructive interference of the added first and second optical sources is outputted.

2. The wavelength converter as claimed in claim 1, wherein in the first optical source outputted from the first semiconductor optical amplifier, no phase change occurs.

3. The wavelength converter as claimed in claim 2, wherein the constructive interference occurs if phases of the first and second optical sources coincide with each other.

4. The wavelength converter as claimed in claim 2, wherein the destructive interference occurs if phases of the first and second optical sources do not coincide with each other.

5. The wavelength converter as claimed in claim 1, wherein the size of the first optical source is varied according to the size of the current applied to the first semiconductor optical amplifier.

6. The wavelength converter as claimed in claim 1, further comprising a phase shift medium configured to perform a fine tuning of the wavelength of the first optical source.

7. The wavelength converter as claimed in claim 6, wherein the phase shift medium is disposed between the first semiconductor optical amplifier and the first distributed Bragg reflector.

8. The wavelength converter as claimed in claim 6, wherein the phase shift medium is disposed between the first semiconductor optical amplifier and the second distributed Bragg reflector.

9. The wavelength converter as claimed in claim 1, further comprising a third semiconductor optical amplifier configured to adjust the size of the input data optical source.

10. The wavelength converter as claimed in claim 1, wherein the first semiconductor optical amplifier, the second semiconductor optical amplifier, the first distributed Bragg reflector and the second distributed Bragg reflector are integrated onto the same substrate.

* * * * *